(12) United States Patent
Kung et al.

(10) Patent No.: US 11,923,825 B2
(45) Date of Patent: Mar. 5, 2024

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Cheng-Yuan Kung, Kaohsiung (TW); Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 165 days.

(21) Appl. No.: 17/383,264

(22) Filed: Jul. 22, 2021

(65) Prior Publication Data

US 2023/0024293 A1   Jan. 26, 2023

(51) Int. Cl.
| | | |
|---|---|---|
| *H03H 9/05* | (2006.01) | |
| *H01L 23/552* | (2006.01) | |
| *H03H 9/10* | (2006.01) | |
| *H03H 9/54* | (2006.01) | |
| *H05K 3/34* | (2006.01) | |
| *H01L 23/00* | (2006.01) | |

(52) U.S. Cl.
CPC ......... *H03H 9/0552* (2013.01); *H01L 23/552* (2013.01); *H03H 9/0542* (2013.01); *H03H 9/10* (2013.01); *H03H 9/54* (2013.01); *H05K 3/34* (2013.01); *H01L 24/48* (2013.01); *H01L 24/49* (2013.01); *H01L 2224/48105* (2013.01); *H01L 2224/48227* (2013.01); *H01L 2224/4903* (2013.01); *H01L 2924/14215* (2013.01)

(58) Field of Classification Search
None
See application file for complete search history.

(56) References Cited

U.S. PATENT DOCUMENTS

| | | | |
|---|---|---|---|
| 10,497,650 B2 | 12/2019 | Kim et al. | |
| 2006/0113642 A1* | 6/2006 | Kajiki | H01L 21/565 |
| | | | 257/E23.079 |
| 2014/0028518 A1* | 1/2014 | Arnold | H01Q 1/2283 |
| | | | 343/841 |
| 2020/0091029 A1* | 3/2020 | Jeng | H01L 23/36 |
| 2021/0036682 A1* | 2/2021 | Kamgaing | H03H 9/1071 |
| 2021/0257311 A1* | 8/2021 | Hsieh | H01L 23/552 |

* cited by examiner

*Primary Examiner* — Sarah K Salerno
(74) *Attorney, Agent, or Firm* — FOLEY & LARDNER LLP (57) ABSTRACT

A semiconductor device and a method of manufacturing a semiconductor device are provided. The semiconductor device includes a carrier, an element, and a first electronic component. The element is disposed on the carrier. The first electronic component is disposed above the element. The element is configured to adjust a first bandwidth of a first signal transmitted from the first electronic component.

1 Claim, 11 Drawing Sheets

SEMICONDUCTOR DEVICE AND METHOD FOR MANUFACTURING THE SAME

BACKGROUND

1. Field of the Disclosure

The present disclosure relates to a semiconductor device and a method for manufacturing the same.

2. Description of the Related Art

A radio-frequency front-end module (RF FEM) plays an important role in communication technology. An RF FEM may be required to process high-band, mid-band, and/or low band signals. Owing to the multiple functions of an RF FEM, its size may be large. As such, the rate at which an RF FEM can shrink may not be able to keep pace with electronic products (e.g., mobile phones) that are ever shrinking in size.

SUMMARY

In some embodiments, a semiconductor device includes a carrier, an element, and a first electronic component. The element is disposed on the carrier. The first electronic component is disposed above the element. The element is configured to adjust a first bandwidth of a first signal transmitted from the first electronic component.

In some embodiments, a semiconductor device includes a carrier, a plurality of elements, an electronic component, and a layer. The elements are disposed on the carrier. The electronic component is disposed on the carrier. The layer is disposed on the elements and configured to compensate for the different heights of the elements in respect to the carrier. The electronic component is disposed over the layer and electrically connected to at least one of the elements.

In some embodiments, a method of manufacturing a semiconductor device includes: (a) providing a carrier with a set of first electronic components disposed thereon, the set of first electronic components having various heights; (b) forming a layer on the set of first electronic components to compensate for the various heights of the set of first electronic components; and (c) disposing a second electronic component on the layer. The second electronic component is configured to electrically connect to at least one of the set of first electronic components

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
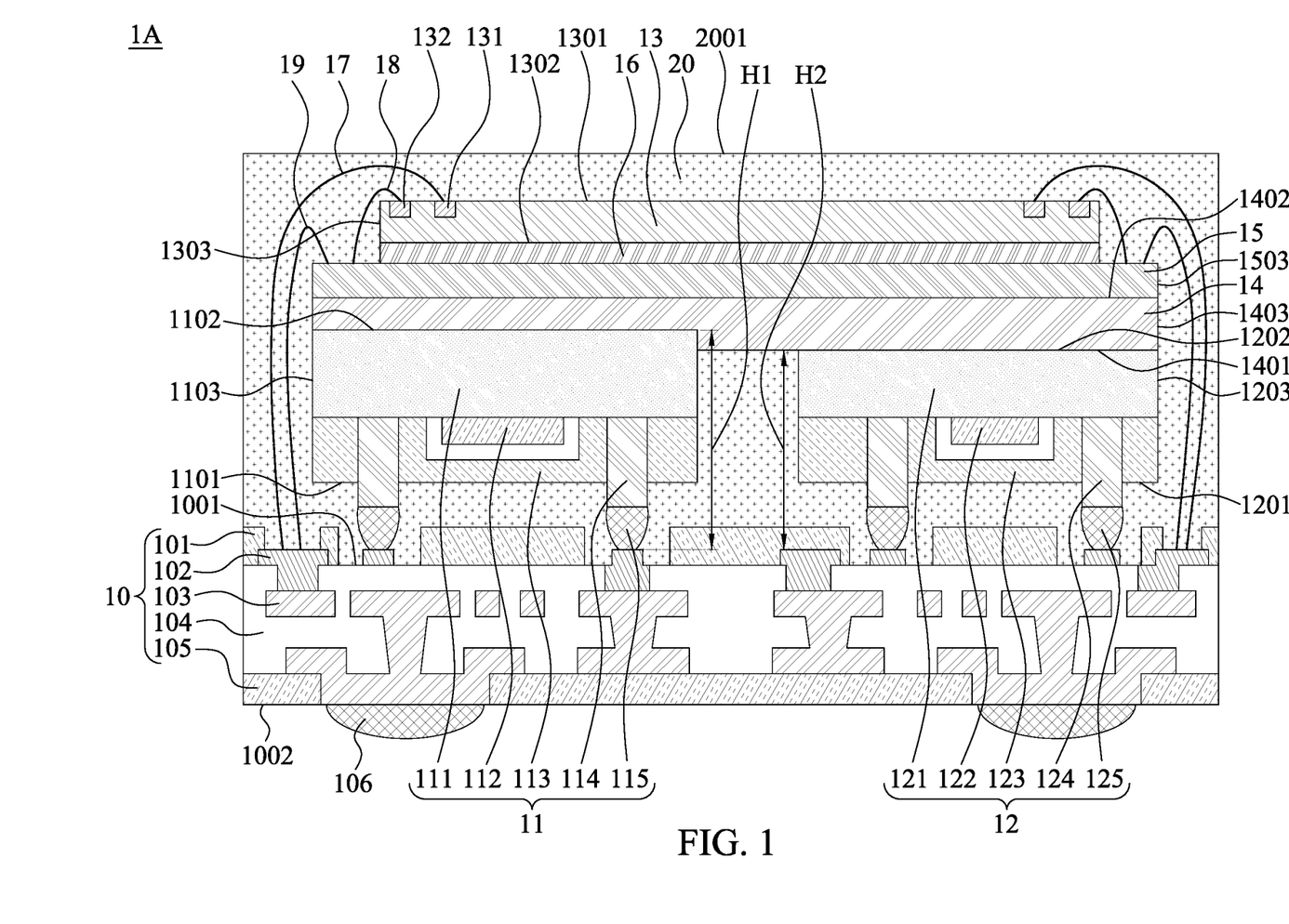
FIG. 1 illustrates a cross-sectional view of a semiconductor device according to some embodiments of the present disclosure.

FIG. 1 illustrates a cross-sectional view of a semiconductor device 1A according to some embodiments of the present disclosure. The semiconductor package device 1A may include a carrier 10, an element 11, an element 12, an electronic component 13, a layer 14, a shielding element 15, an adhesive layer 16, a connection element 17, a connection element 18, a connection element 19, and an encapsulant 20.

The carrier 10 (e.g., a substrate) may have a first surface 1001 and a second surface 1002 opposite to the first surface 101. The carrier 10 may include a redistribution layer (RDL) structure. The RDL structure of the carrier 10 may include a protection layer 101, a conductive pad 102, a circuit layer 103, a dielectric layer 104, a protection layer 105, and a plurality of solders 106. The protection layer 101 may be disposed on the dielectric layer 104. The conductive pad 102 may be exposed by the protection layer 101. The conductive pad 102 may be electrically connected to the circuit layer 103. The circuit layer 103 may be disposed in the dielectric layer 104. As shown in FIG. 1, the circuit layer 103 may include a conductive layer or a conductive pillar. The protection layer 105 may be disposed on the dielectric layer 102. The circuit layer 103 may be exposed by the protection layer 105. The plurality of solders 106 may be electrically connected to the circuit layer 103. The circuit layer 103 may be electrically connected to an external carrier (not shown) through the plurality of solders 10.

The protection layer 101 may include, for example, but is not limited to, a solder resist. The conductive pad 102 may include, for example, but is not limited to, a conductive material, such as a metal or alloy. The circuit layer 103 may include, for example, but is not limited to, a conductive material, such as a metal or alloy. The dielectric layer 104 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets. The protection layer 105 may include, for example, but is not limited to, a solder resist.

The element 11 may be disposed on the carrier 10 (e.g., on the surface 1001). The element 11 may be disposed over the carrier 10. The element 11 may have an active surface 1101 facing the carrier 10 and a backside surface 1102 facing away from the carrier 10. The element 11 may have a lateral surface 1103 extending between the active surface 1101 and the backside surface 1102. The element 11 may include a body 111, a processing element 112, a protection layer 113, a conductive pillar 114, and a solder 115. The processing element 112 may be disposed on the body 111. The body 111 may include a circuit layer electrically connecting the processing element 112 with the conductive pillar 114. The protection layer 113 may cover the processing element 112. The conductive pillar 114 of the element 11 may be electrically connected to the conductive pad 102 of the carrier 10 through the solder 115 of the element 11. In other words, the element 11 may be electrically connected to the carrier 10.

The body 111 may include, for example, but is not limited to, a silicon layer. The protection layer 113 may include, for example, but is not limited to, a solder resist. The conductive pillar 114 may include, for example, but is not limited to, a conductive material, such as a metal or alloy.

The electronic component 13 may be disposed above the element 11. The electronic component 13 may have an active surface 1301 facing away from the carrier 10 and a backside surface 1302 opposite to the active surface 1301. The electronic component 13 may have a lateral surface 1303 extending from between the active surface 1301 and the backside surface 1302. The electronic component 13 may include a signal terminal 131 and a ground terminal 132. The electronic component 13 (e.g., the signal terminal 131) may be electrically connected to the carrier 10 through the connection element 17. The electronic component 13 to the element 11 through the carrier 10. The connection element 17 may be along the lateral surface 1303 of the electronic component 13 and the lateral surface 1103 of the element 11. The connection element 17 may include a conductive wire. The connection element 17 may be configured for an impedance matching of the electronic component 13.

The electronic component 13 may include an RF active device. The electronic component 13 may include at least one of an amplifying circuit, such as a power amplifier or a low noise amplifier, an RF switch.

In some embodiments, the processing element 112 of the element 11 may include a filter, such as a surface acoustic wave (SAW) filter, a bulk acoustic wave (BAW) filter, a film bulk acoustic resonator (FBAR) filter, or others. The element 11 may be a bandwidth adjusting element configured to receive a signal and adjust a bandwidth of the signal. The electronic component 13 may be physically disconnected and electrically connected to the bandwidth adjusting element 11. The bandwidth adjusting element 11 may be configured to adjust a first bandwidth of a first signal transmitted from the electronic component 13. In some embodiments, the bandwidth adjusting element 11 may be configured to generate a second signal having a second bandwidth narrower than the first bandwidth in response to the first signal. In some embodiments, the bandwidth adjusting element 11 may be configured to generate a second signal having a second bandwidth wider than the first bandwidth in response to the first signal. Alternatively, the bandwidth adjusting element 11 may be configured to shift the first bandwidth of the first signal to a second bandwidth.

In some comparative embodiments, an RF FEM may include a circuit board, an amplifier, and a filter. Both the amplifier and the filter are attached to the surface of the circuit board. The RF FEM may have a relatively large size and may not fit into the ever-shrinking electronic products (e.g., mobile phones). The present disclosure provides a compact structure including the bandwidth adjusting element 11 and the element 11 stacked thereon. Such a compact structure can significantly reduce the size of the semiconductor device 1A.

The element 12 may be disposed on the carrier 10 (e.g., on the surface 1001). The element 12 may be disposed over the carrier 10. The element 12 may have an active surface 1201 facing the carrier 10 and a backside surface 1202 facing away from the carrier 10. The element 12 may have a lateral surface 1203 extending between the active surface 1201 and the backside surface 1202. The element 12 may include a body 121, a processing element 122, a protection layer 123, a conductive pillar 124, and a solder 125. The processing element 122 may be disposed on the body 121. The body 121 may include a circuit layer electrically connecting the processing element 122 with the conductive pillar 124. The protection layer 123 may cover the processing element 122. The conductive pillar 124 of the element 12 may be electrically connected to the conductive pad 102 of the carrier 10 through the solder 125 of the element 12. In other words, the element 12 may be electrically connected to the carrier 10. The connection element 17 may electrically connect the electronic component 13 to the element 12. The connection element 17 may be along the lateral surface 1303 of the electronic component 13 and the lateral surface 1203 of the element 12.

The body 121 may include, for example, but is not limited to, a silicon layer. The protection layer 123 may include, for example, but is not limited to, a solder resist. The conductive pillar 124 may include, for example, but is not limited to, a conductive material, such as a metal or alloy.

In some embodiments, the processing element 122 of the element 12 may include a filter, such as a surface acoustic wave (SAW) filter, a bulk acoustic wave (BAW) filter, a film bulk acoustic resonator (FBAR) filter, or others. The element 12 may be a bandwidth adjusting element configured to receive a signal and adjust a bandwidth of the signal. The bandwidth adjusting element 12 may be configured to adjust a first bandwidth of a first signal transmitted from the electronic component 13. In some embodiments, the bandwidth adjusting element 12 may be configured to generate a second signal having a second bandwidth narrower than the first bandwidth in response to the first signal. In some embodiments, the bandwidth adjusting element 12 may be configured to generate a second signal having a second bandwidth wider than the first bandwidth in response to the first signal. Alternatively, the bandwidth adjusting element 12 may be configured to shift the first bandwidth of the first signal to a second bandwidth. In some embodiments, the electronic component 13 may be electrically connected to at least one of the elements 11 and 12.

In the present disclosure, the elements 11 and 12 may be referred to as bandwidth adjusting elements including a plurality of sets of filters configured to filter one or more signals into various bandwidths. Furthermore, the elements 11 and 12 may each include electronic component.

In some embodiments, the element 11 may include a capacitor, an inductor, or a resistor. The element 11 may include a stacking structure. Furthermore, the element 11 may include a MEMS component, or an integrated circuit. In some embodiments, the element 12 may include a capacitor, an inductor, or a resistor. The element 12 may include a stacking structure. Furthermore, the element 12 may include a MEMS component, or an integrated circuit.

Referring again to FIG. 1, the element 11 and the element 12 may have different heights. The element 11 may have a height H1 and the element 12 may have a height H2. The height H1 may be greater than the height H2. Furthermore, the backside surface 1102 of the element 11 may be higher than the backside surface 1202 of the element 12 with respect to the carrier 10.

The layer 14 may be disposed between the electronic component 13 and the element 11 or the element 12. The layer 14 may be disposed over the element 11 and the element 12. The layer 14 may include a leveling layer. The layer 14 may be configured to be flexible to compensate for the different heights of the element 11 and the element 12. In other words, the layer 14 may be disposed between the electronic component 13 and the filters of the element 11 and the element 12 may be configured to compensate for the different heights of the filters in respect to the carrier 10. The layer 14 may have a surface 1401 facing the carrier 10 and a surface 1402 opposite to the surface 1401. The surface 1402 of the layer 14 may be smoother than the surface 1403. As such, the smoother surface 1402 of the layer 14 allows the electronic component 13 to be disposed over the layer 14 without difficulty.

The layer 14 may include, for example, but is not limited to, an adhesive layer. For example, the layer 14 may include a die attach film (DAF), a glue, or a tape.

In some embodiments, the semiconductor device 1A may include a set of elements similar to the elements 11 and 12. The number of the set of elements may be a positive integer. The set of the elements may have various heights. The layer 14 may be configured to compensate for the different heights of the set of elements in respect to the carrier 10. Furthermore, at least one of the set of elements may include a filter. Each of the set of elements may be configured to receive a signal and adjust a bandwidth of the signal.

The electronic component 13 may be configured to adjust power of a signal. The electronic component 13 may include an RF active device. The electronic component 13 may include at least one of an amplifying circuit, such as a power amplifier or a low noise amplifier, and an RF switch. An intensity of electromagnetic radiated from the electronic component 13 may be higher than an intensity of electromagnetic radiated from the bandwidth adjusting element (e.g., the element 11 and the element 12). The substrate 15 may be disposed on the element 11 and the element 12. The substrate 15 may be disposed between the element 11 and the electronic component 13 or between the element 12 and the electronic component 13. The substrate 15 may be disposed between the electronic component 13 and the layer 14. The substrate 15 may be a shielding element configured to block electromagnetic interference (EMI) between the bandwidth adjusting element (e.g., the element 11 or the element 12) and the electronic component 13.

The substrate 15 may have a lateral surface 1503 and the layer 14 may have a lateral surface 1403. The lateral surface 1403 of the layer 14 and the lateral surface 1503 of the substrate 15 may be substantially coplanar. The substrate 15 may include a conductive material, such as a metal or alloy.

The substrate 15 (i.e., a shielding element) may include an organic substrate with circuits or redistribution layer (RDL). The substrate 15 may include a conductive pad electrically connected to the ground terminal 132 of the electronic component 13 through the connection element 18. The connection element 18 may include a conductive wire. The substrate 15 may have a conductive pad electrically connected to a ground layer of the carrier 10 through the connection element 19. The electronic component 13 may be electrically connected to the carrier 10 through the substrate 15. The connection element 19 may include a conductive wire. The connection element 19 may surround the bandwidth adjusting element (e.g., the element 11 or the element 12). The connection element 19 may be a shielding element configured to block an electromagnetic wave radiated from the bandwidth adjusting element (e.g., the element 11 or the element 12) in a lateral direction of the shielding element 19. The second substrate 15 may be configured to block an electromagnetic wave radiated between the elements 11 and 12 and the electronic component 13. Furthermore, the shielding element 19 and the substrate 15 may be configured to form an EMI shield covering the bandwidth adjusting elements (e.g., the element 11 and the element 12).

The encapsulant 20 may be disposed on the carrier 10. The encapsulant 20 may cover the element 11, the element 12, the electronic component 13, the layer 14, the shielding element 15, the adhesive layer 16, the connection element 17, the connection element 18, or the connection element 19. The encapsulant 20 may have a surface 2001. The active surface 1301 of the electronic component 13 may be closer to the surface 2001, such that the heat of the electronic component 13 may be efficiently dissipated to an external environment. Furthermore, the electronic component 13 may be attached to the substrate 15 through the adhesive layer 16. The heat of electronic component 13 may be dissipated to the substrate 15. Since the substrate 15 may include a material with relatively great thermal conductivity, the heat of electronic component 13 may be effectively dissipated to the encapsulant 20 through the substrate 15.

Figure 2:
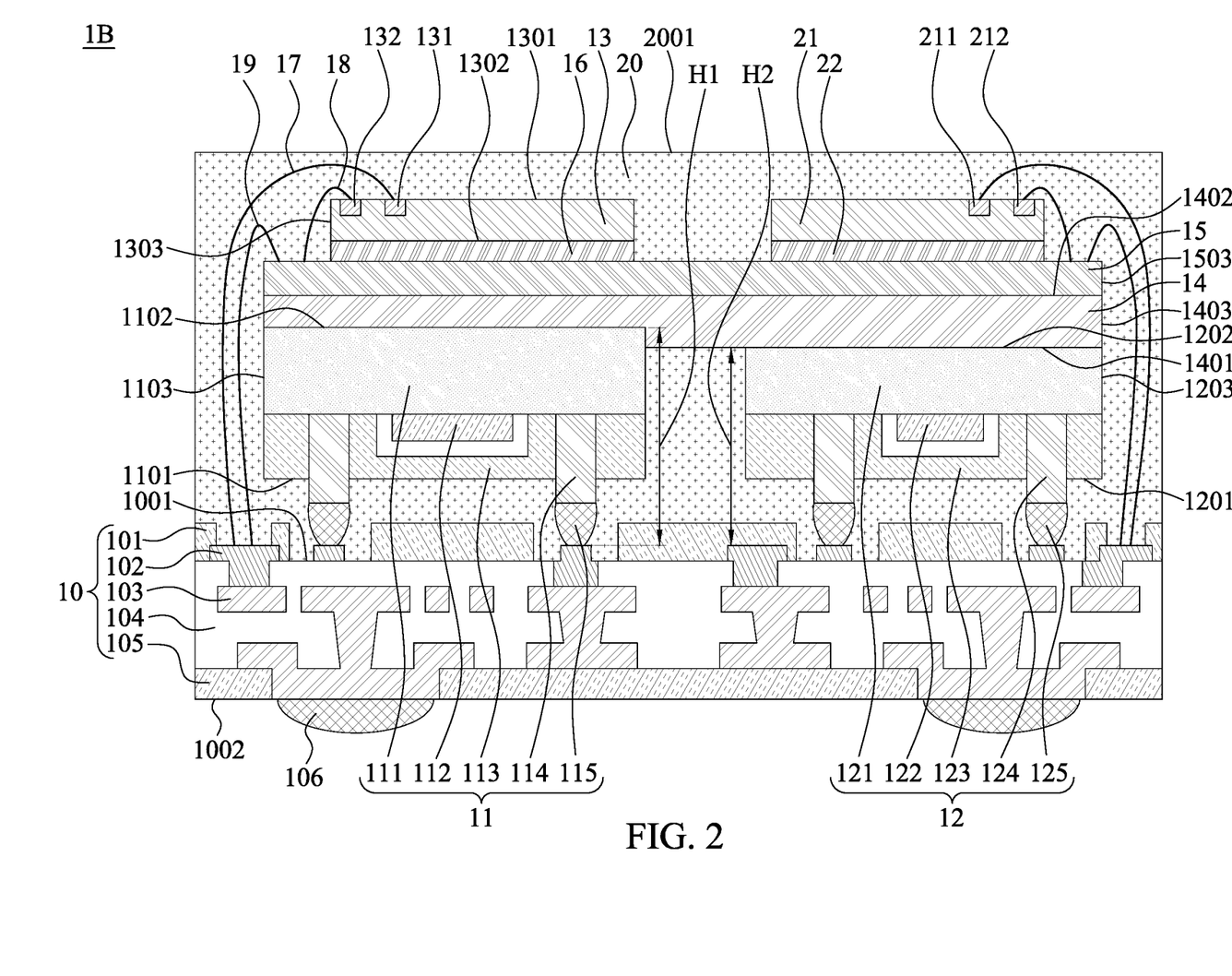
FIG. 2 illustrates a cross-sectional view of a semiconductor device according to some embodiments of the present disclosure.

FIG. 2 illustrates a cross-sectional view of a semiconductor device 1B according to some embodiments of the present disclosure. The semiconductor device 1B of FIG. 2 is similar to the semiconductor device 1A of FIG. 1, and the differences therebetween are described below.

The semiconductor device 1B may further include an electronic component 21 disposed above the bandwidth adjusting element (the element 11 or the element 12). The electronic component 21 may be disposed over the layer 14. The electronic component 21 may be disposed over the substrate 15. The electronic component 21 may be attached to the substrate 15 through an adhesive layer 22. The electronic component 13 and the electronic component 21 may be disposed at substantially the same elevation with respect to the carrier 10. The electronic component 21 may include a signal terminal 211 and a ground terminal 212. The electronic component 21 (e.g., the signal terminal 211) may be electrically connected to the carrier 10 through the connection element 17. The connection element 17 may be configured for an impedance matching of the electronic component 21. The bandwidth adjusting element (the element 11 and/or the element 12) may be configured to transmit a signal to the electronic component 21. For example, the bandwidth adjusting element may be configured to receive a first signal with a first bandwidth from the electronic component 13. The bandwidth adjusting element may be configured to generate a second signal having a second bandwidth narrower than the first bandwidth in response to the first signal. The bandwidth adjusting element may be configured to transmit the second signal to the electronic component 21. The electronic component 21 (e.g., the ground terminal 212) may be electrically connected to the substrate 15 through the connection element 18.

The electronic component 21 may include an RF active device. The electronic component 21 may include at least one of an amplifying circuit, such as a power amplifier or a low noise amplifier, and an RF switch. An intensity of electromagnetic radiated from at least one of the electronic component 13 and the electronic component 21 may be higher than an intensity of electromagnetic radiated from the bandwidth adjusting element (e.g., the element 11 and the element 12). The substrate 15 may be disposed between the element 11, the element 12 and the electronic component 21. The substrate 15 may be a shielding element configured to block electromagnetic interference (EMI) between the bandwidth adjusting element and the electronic component 21.

Figure 3:
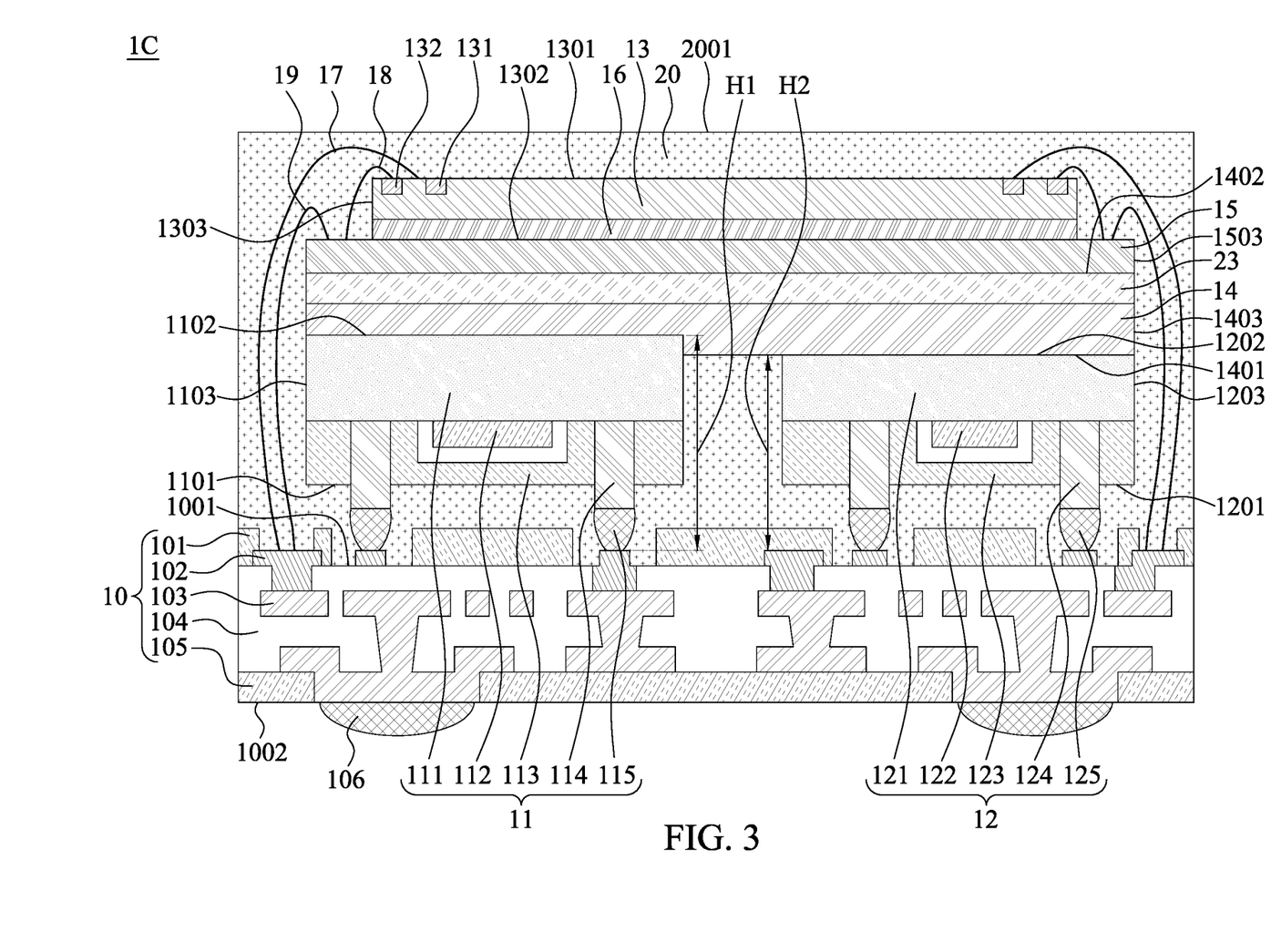
FIG. 3 illustrates a cross-sectional view of a semiconductor device according to some embodiments of the present disclosure.

FIG. 3 illustrates a cross-sectional view of a semiconductor device 1C according to some embodiments of the present disclosure. The semiconductor device 1C of FIG. 3 is similar to the semiconductor device 1A of FIG. 1, and the differences therebetween are described below.

The semiconductor device 1C may further include a leveling layer 23 disposed between the layer 14 and the substrate 15. The leveling layer 23 may be flexible to compensate for the different heights of the element 11 and the element 12. The leveling layer 23 may be a reinforcement element configured to reinforce the rigidity of the semiconductor device 1C. The leveling layer 23 may include, for example, but is not limited to, a silicon layer.

Figure 4:
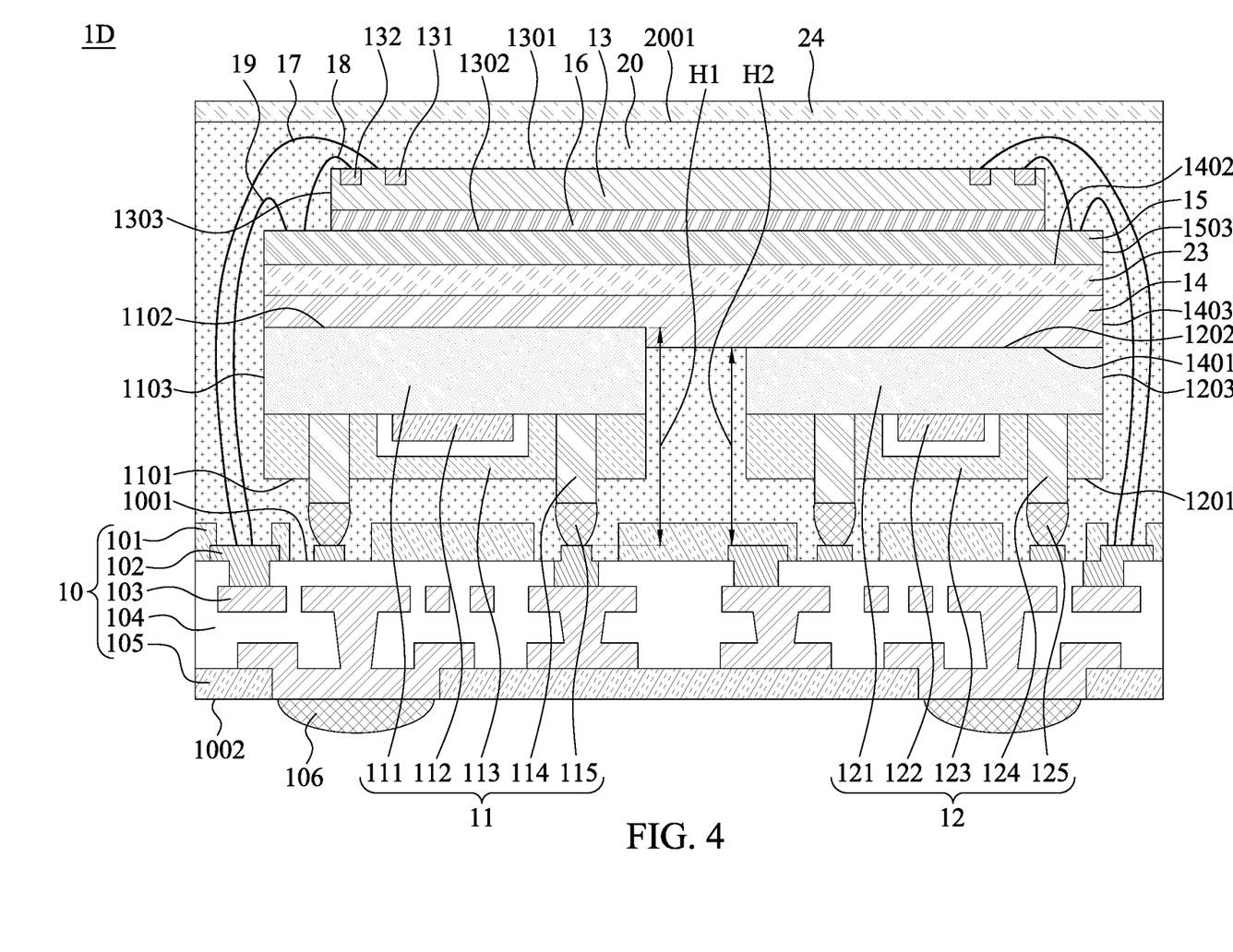
FIG. 4 illustrates a cross-sectional view of a semiconductor device according to some embodiments of the present disclosure.

FIG. 4 illustrates a cross-sectional view of a semiconductor device 1D according to some embodiments of the present disclosure. The semiconductor device 1D of FIG. 4 is similar to the semiconductor device 1C of FIG. 3, and the differences therebetween are described below.

The semiconductor device 1D may further include a shielding element 24 disposed on the surface 2001 of the encapsulant. The shielding element 24 may be configured to block EMI between the electronic component 13 and an external device. The shielding element 24 may include, for example, but is not limited to, a conductive material, such as a metal or alloy.

Figure 5:
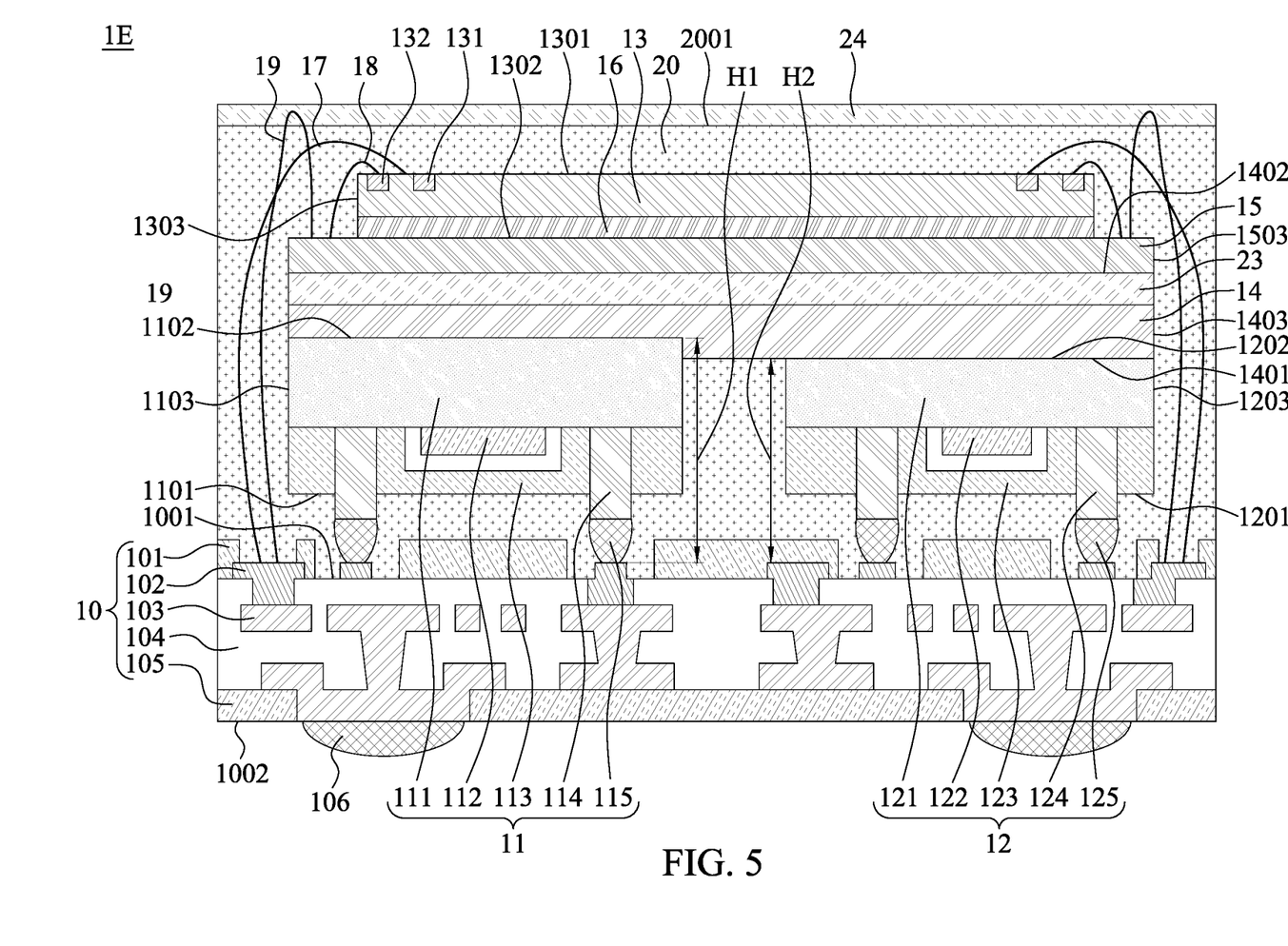
FIG. 5 illustrates a cross-sectional view of a semiconductor device according to some embodiments of the present disclosure.

FIG. 5 illustrates a cross-sectional view of a semiconductor device 1E according to some embodiments of the present disclosure. The semiconductor device 1E of FIG. 5 is similar to the semiconductor device 1D of FIG. 4, and the differences therebetween are described below.

The connection element 19 may extend to the shielding element 24. The connection element 19 may be in contact with the shielding element 24. The connection element 19 may surround the electronic component 13 to block an electromagnetic wave radiating from the electronic component 13 in a lateral direction of the connection element 19.

Figure 6:
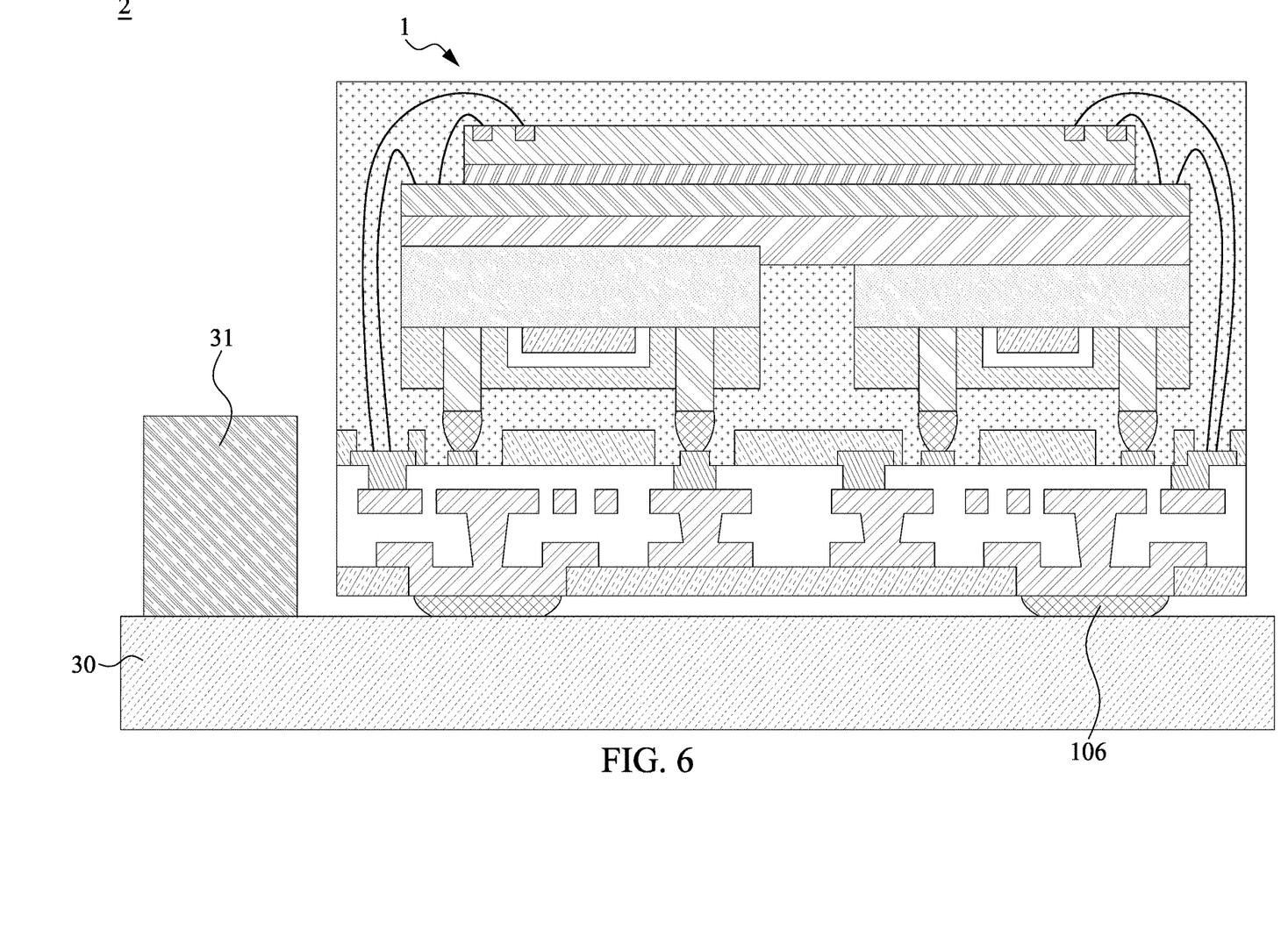
FIG. 6 illustrates a cross-sectional view of a semiconductor device according to some embodiments of the present disclosure.

FIG. 6 illustrates a cross-sectional view of a semiconductor device 2 according to some embodiments of the present disclosure. The semiconductor device 2 of FIG. 6 is similar to the semiconductor device 1A of FIG. 1, and the differences therebetween are described below.

The semiconductor device 2 may include a carrier 30, the semiconductor device 1A, and a surface mount technology (SMT) device 31. The semiconductor device 1A may be disposed on the carrier 30. The SMT device 31 may be disposed on the carrier 30 and adjacent to the semiconductor device 1A. The semiconductor device 1A may be electrically connected to the SMT through a circuit layer of the carrier 30.

The carrier 30 may include, for example, but is not limited to, a printed circuit board (PCB), such as a paper-based copper foil laminate, a composite copper foil laminate, or a polymer-impregnated glass-fiber-based copper foil laminate. The connection element 51 may include, for example, but is not limited to, solder, adhesive (which may include a conductive adhesive (e.g., resin mixed with conductive particles)), or other suitable bonding material(s). The SMT device 31 may include, for example, but is not limited to, a capacitor, an inductor, a resistor, or a transistor.

FIGS. 7, 8, 9, 10, and 11 illustrate one or more stages of an example of a method for manufacturing a semiconductor device (e.g., the semiconductor device 1A of FIG. 1) according to some embodiments of the present disclosure.

Figure 7:
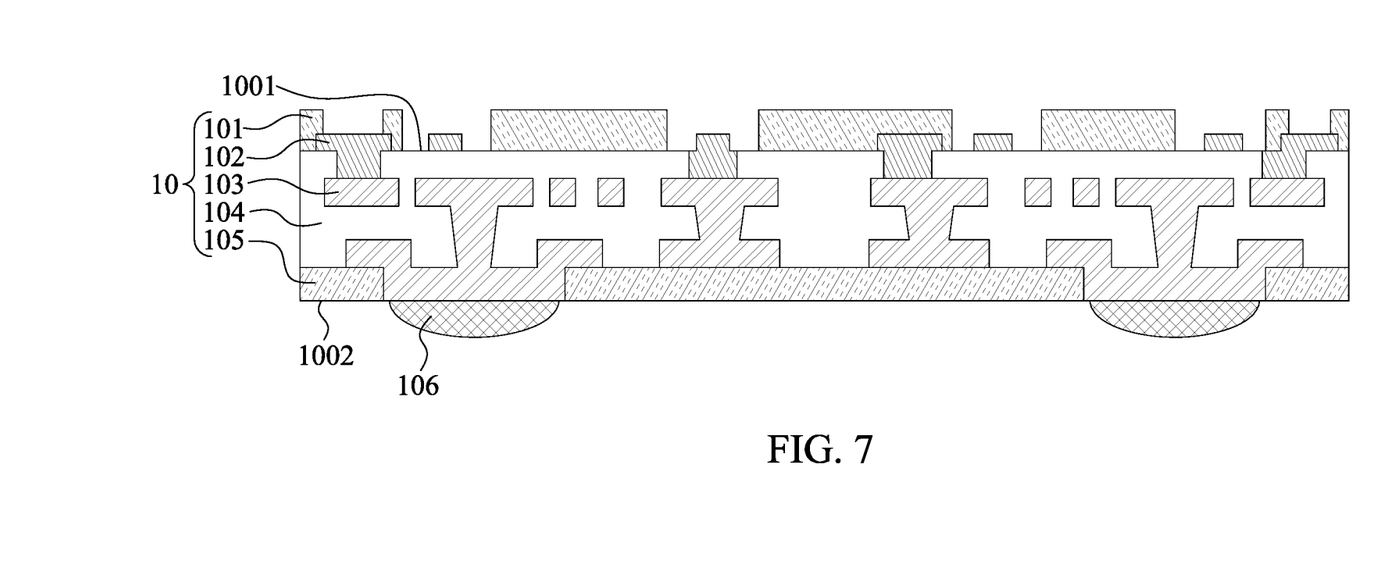
FIGS. 7, 8, 9, 10, and 11 illustrate one or more stages of an example of a method for manufacturing a semiconductor device according to some embodiments of the present disclosure.

Referring to FIG. 7, a carrier 10 may be provided. The carrier 10 may have a surface 1001 and a surface 1002 opposite to the surface 1001. The carrier 10 may be an RDL structure including a protection layer 101, a conductive pad 102, a circuit layer 103, a dielectric layer 104, a protection layer 105, and a plurality of solders 106.

Figure 8:
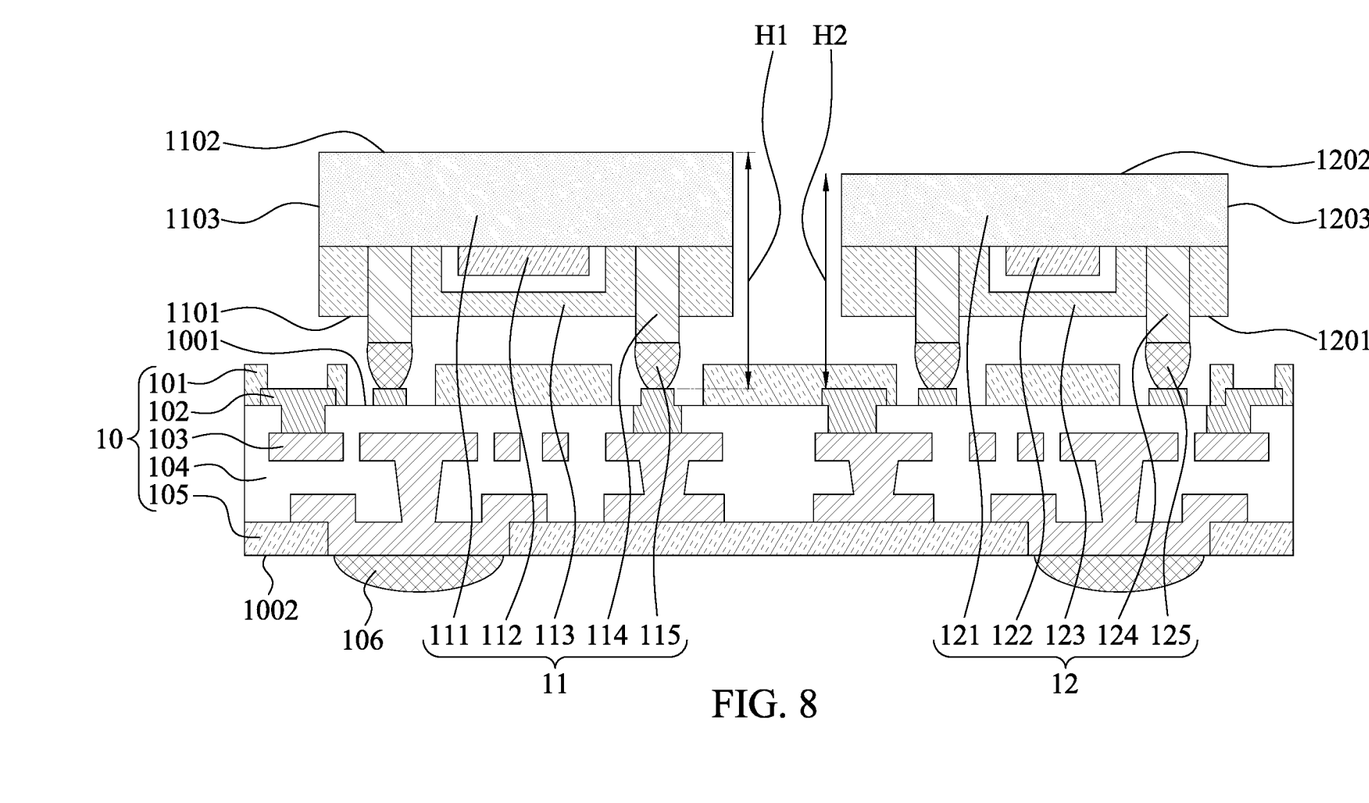

Referring to FIG. 8, an element 11 may be attached to the carrier 10. The element 11 may have an active surface 1101 facing the carrier 10, a backside surface 1102 opposite to the active surface, and a lateral surface 1103 extending between the active surface 1101 and the backside surface 1102. The element 11 may include a body 111, a processing element 112, a protection layer 113, a conductive pillar 114, and a solder 115. The element 11 may be electrically connected to the carrier 10.

Again referring to FIG. 8, an element 12 may be attached to the carrier 10. The elements 11 and 12 may be referred as a set of electronic components. The element 12 may have an active surface 1201 facing the carrier 10, a backside surface 1202 opposite to the active surface, and a lateral surface 1203 extending between the active surface 1201 and the backside surface 1202. The element 12 may include a body 121, a processing element 122, a protection layer 123, a conductive pillar 124, and a solder 125. The element 12 may be electrically connected to the carrier 10.

The set of electronic components may have various heights. The element 11 may have a height H1 and the element 12 may have a height H2. The height H1 may be greater than the height H2. In some embodiments, the set of electronic components may include more elements other than the element 11 and the element 12 may be disposed over the carrier 10. At least one of the set of electronic components may include a filter.

Figure 9:
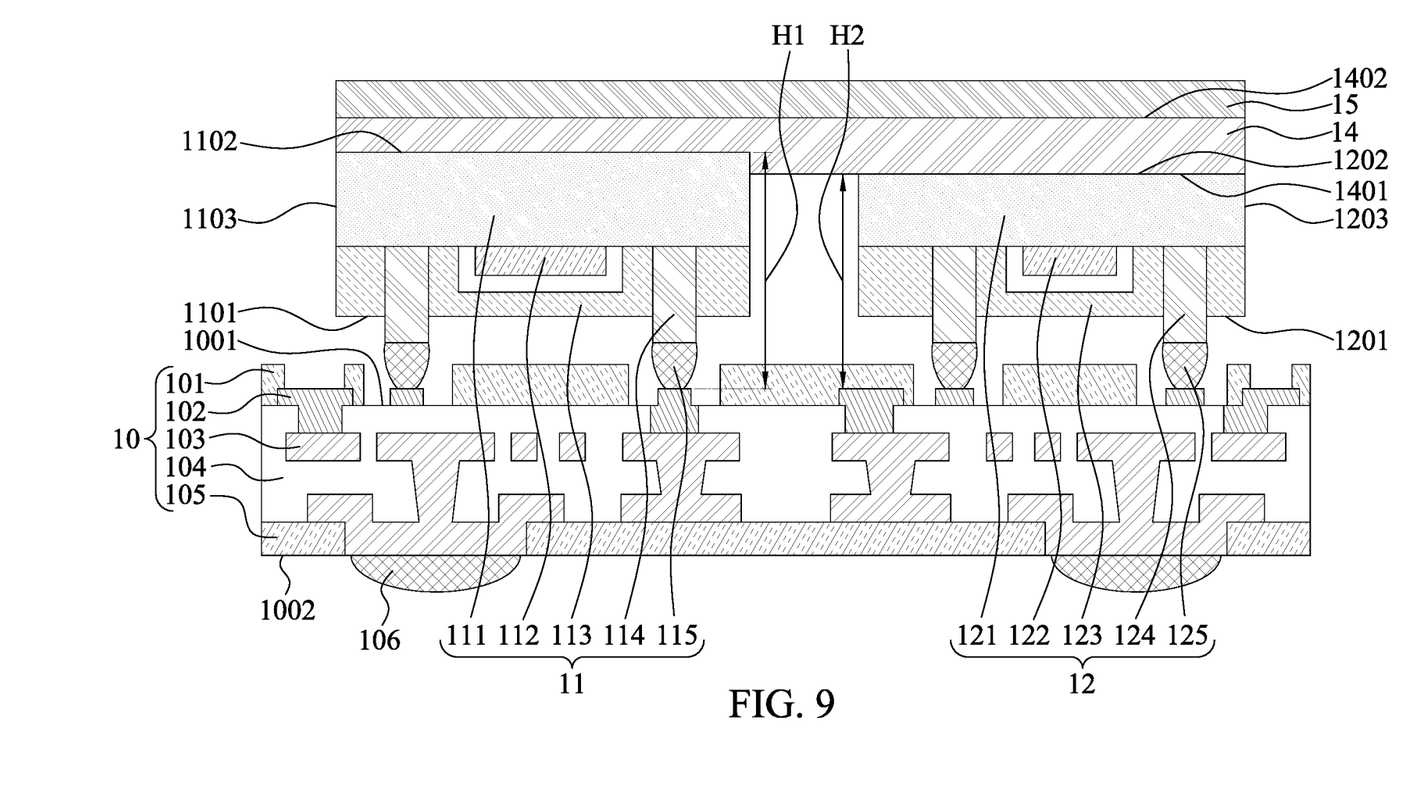

Referring to FIG. 9, a layer 14 may be formed on the set of elements to compensate for the various heights of the set of elements. The layer 14 has a surface 1401 facing the carrier 10 and a surface 1402 opposite to the surface 1401, and the surface 1402 of the layer 14 is smoother than the surface 1401. In some embodiments, the layer 14 may include an adhesive layer and/or a silicon layer.

Again referring to FIG. 9, a substrate 15 may be formed on the layer 14.

Figure 10:
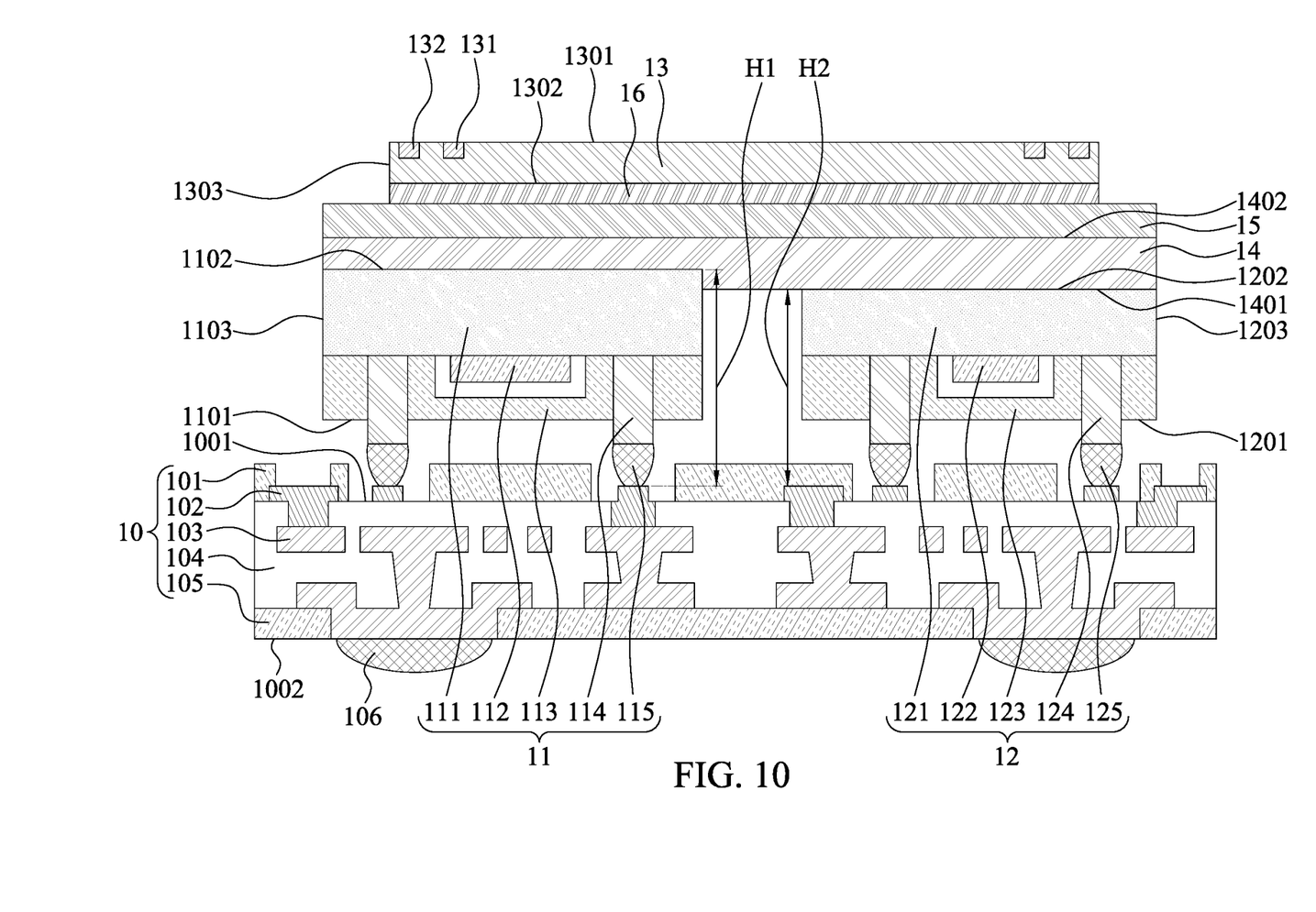

Referring to FIG. 10, an electronic component 13 may be disposed on the layer 14. The electronic component 13 may be attached to the substrate 15 through an adhesive layer 16.

The electronic component 13 may have an active surface 1301 facing away from the carrier 10 and a backside surface opposite to the active surface 1301. The electronic component 13 may include an RF active device. The electronic component 13 may include a signal terminal 131 and a ground terminal 132 along the active surface 1301.

Figure 11:
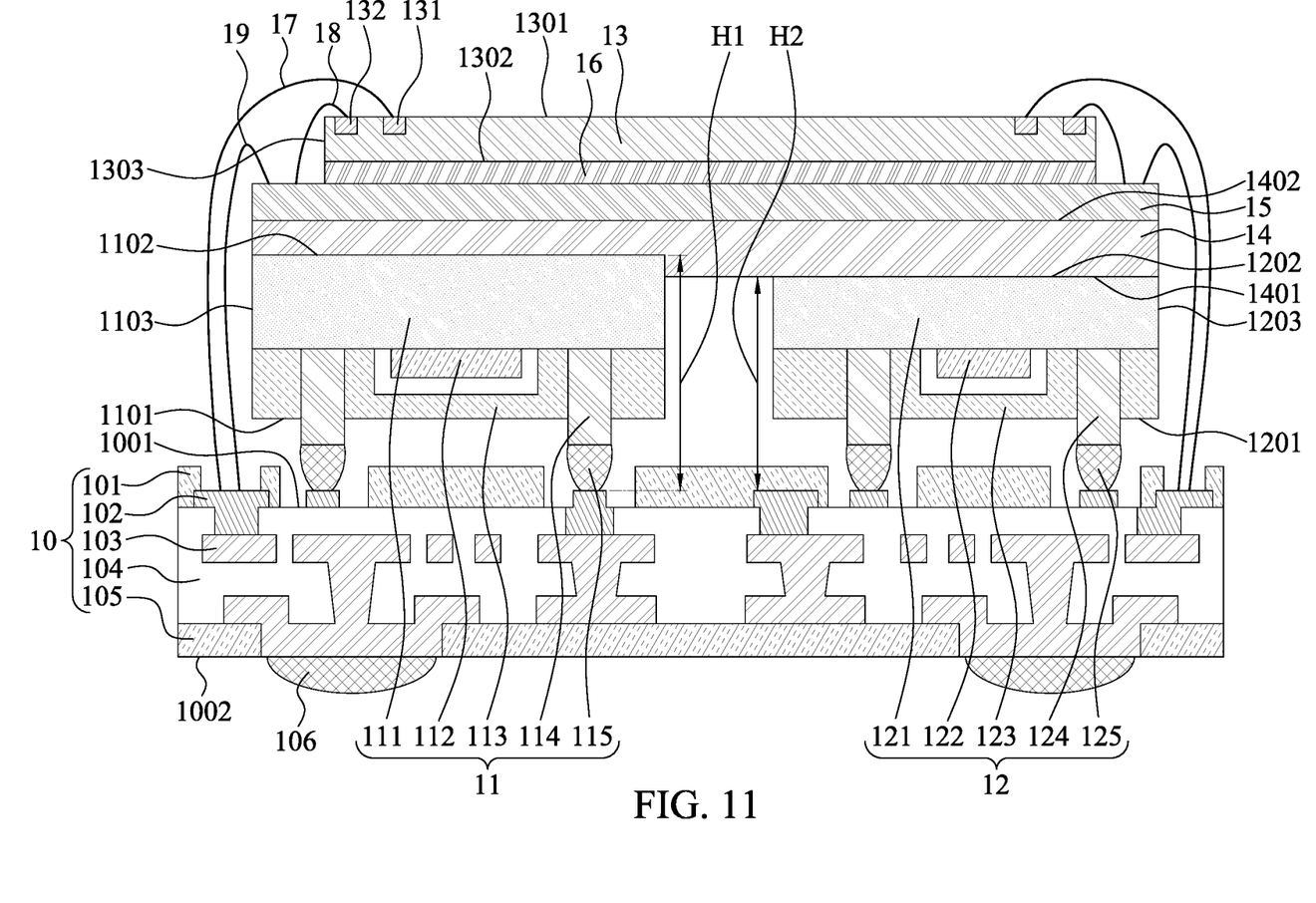

Referring to FIG. 11, a connection element 17 may be formed to electrically connect the electronic component 13 (e.g., the signal terminal 131) to the carrier 10. A connection element 18 may be formed to electrically connect the electronic component (e.g., the ground terminal 132) to the substrate 15. The electronic component 13 may be electrically connected to the carrier 10 or the substrate 15. The electronic component 13 may be electrically connected to at least one of the set of electronic components (e.g., the elements 11 and 12) through the substrate 15 and the carrier 10.

Referring again to FIG. 11, a connection element 19 may be formed to electrically connect the substrate 15 to a ground layer of the carrier 10. The connection element 19 may surround the set of the elements to block an electromagnetic wave radiating from the set of the elements in a lateral direction of the connection element 19.

Afterwards, an encapsulant (e.g., the encapsulant 20 of FIG. 1) may be formed to cover the element 11, the element 12, the electronic component 13, the layer 14, the shielding element 15, the adhesive layer 16, the connection element 17, the connection element 18, or the connection element 19, and then to form the semiconductor device 1A of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing a semiconductor device, comprising:
   (a) providing a carrier with a set of electronic components disposed thereon, the set of electronic components having various heights;
   (b) forming a layer on the set of electronic components to compensate for the various heights of the set of electronic components, wherein the layer is in contact with a first portion of a lateral surface of one of the set of electronic components, and exposes a second portion of the lateral surface; and
   (c) electrically connecting an active device over the layer to at least one of the set of electronic components.

* * * * *